United States Patent [19]
Helms

[11] Patent Number: 5,969,575
[45] Date of Patent: Oct. 19, 1999

[54] CLASS A/F AMPLIFIER HAVING SECOND AND THIRD ORDER HARMONIC INPUT AND OUTPUT FILTERING AND SELF BIAS DISTORTION CORRECTION

[75] Inventor: David Richard Helms, Veneta, Oreg.

[73] Assignee: Alcatel, Paris, France

[21] Appl. No.: 08/988,565

[22] Filed: Dec. 11, 1997

[51] Int. Cl.$^6$ .................................. H03F 1/34; H03F 3/04
[52] U.S. Cl. ............................................ 330/294; 330/306
[58] Field of Search ................................ 330/53, 56, 107, 330/109, 207 A, 251, 277, 286, 290, 294, 306

[56] References Cited

U.S. PATENT DOCUMENTS 5,347,229  9/1994  Suckling et al. ..................... 330/306

FOREIGN PATENT DOCUMENTS 41963  4/1978  Japan .................................. 330/294

OTHER PUBLICATIONS

H.L. Krauss, Solid State Radio Engineering, John Wiley and Sons, New York 1980, (See pp. 352–355 and 454–448 attached).

"Linear RF Power Amplifier Design for CDMA Signals", by Qiang Wu, Martina Testa, and Robert Larkin, 1996 IEEE MTT–S Digest. p. 851. (To Be Submitted Shortly).

"Highly–Linear Highly–Efficient HBT for Communications Circuits." by R.S. Brozovich, D.R. Helms et al., 1994 GaAs IC p. 291. (To Be Submitted Shortly).

*Primary Examiner*—Robert Pascal
*Assistant Examiner*—Patricia T. Nguyen
*Attorney, Agent, or Firm*—Ware, Fressola, Van Der Sluys & Adolphson LLP

[57] ABSTRACT

A new class A/F amplifier has an filtering and matching input circuit, a summing junction, an amplifying circuit, a filtering and feedback biasing circuit, and an output filtering and matching circuit. The filtering and matching input circuit responds to a radio frequency access input signal, for providing a filtered and matched radio frequency access input signal. The summing junction responds to the filtered and matched radio frequency access input signal, and further responds to a filtering and feedback biasing signal, for providing a summed, filtered, matched and feedback radio frequency access input signal. The amplifying circuit responds to the summed filtered, matched and feedback radio frequency access input signal, for providing an amplified, summed, filtered, matched and feedback radio frequency access input signal. The feedback and filtering biasing circuit responds to the amplified, summed, filtered, matched and feedback radio frequency access input signal, for providing the feedback and filtering biasing signal. The output filtering and matching circuit responds to the amplified, summed, filtered, matched and feedback radio frequency access input signal, for providing an amplified, summed, filtered, matched and feedback radio frequency access output signal. The class A/F amplifier substantially reduces harmonics in the radio frequency signal that cause power interference between adjacent channels, resulting in greatly improved mobile communication service having much fewer dropped calls and an enhanced calling range.

25 Claims, 4 Drawing Sheets

SCHEMATIC OF CLASS A/F AMPLIFIER

Spectral regrowth of 5.5 watt CDMA amplifier at 7 dB output power back-off. Without Class A/F network the amplifier produces only three watts at same linearity.

CLASS A/F AMPLIFIER HAVING SECOND AND THIRD ORDER HARMONIC INPUT AND OUTPUT FILTERING AND SELF BIAS DISTORTION CORRECTION

BACKGROUND OF THE INVENTION

1. Field of the Invention

The present invention relates generally to amplifiers; and more particularly, to amplifiers for mobile communication systems using radio frequency multiple access signals.

2. Description of the Prior Art

In the prior art, class A and F amplifiers for amplifying a radio frequency signal in a base station of a mobile radio communication system are known in the art. However, with today's high peak to average power signals, neither a class A nor a class F amplifier provides adequate harmonic filtering of the radio frequency signal. Because of this, one disadvantage of the prior art class A and F amplifiers is that the harmonics in the radio frequency signal cause power interference between adjacent channels, resulting in degraded mobile communication service, including more dropped calls and a reduced calling range.

For example, the class A amplifier has appreciable power gain, produces a magnified replica of the input signal voltage or current wave, and is typically used in multimode or multi-signal transmitters where accurate reproduction of both the envelope and the phase of the signal is required. Tuned circuits or low-pass filters are not integral components of class A amplifiers, although they may be included to improve harmonic suppression. An example of the class A amplifier is shown and described on pages 352–355 (see FIG. 12-3) of H. L. Krauss, Solid State Radio Engineering, John Wiley and Sons, New York, 1980.

The nonlinearity in class A amplifiers produces two types of unwanted signals, called harmonics and intermodulation distortion (IMD) products. The IMD products (identified as third, fifth, seventh order products) are prominent near the carrier frequency. They cause distortion in the received signal and/or adjacent channel interference. In a typical radio frequency power amplifier, the unwanted harmonics may be removed by filters, but the unwanted IMD products generally cannot be removed. Current code division multiple access (CDMA) amplifiers have a 15 dB peak to average ratio which greatly increases the IMD and harmonics.

The class A amplifier also dissipates large amounts of power to amplify a signal due to the biasing operation in the center of a typical power amplifier load line. Thus the class A amplifier is not an efficient amplifier. Furthermore, the class A amplifier cannot suppress IMD products due to a lack of harmonic traps.

Furthermore, the class A amplifier under large signal conditions tends to self bias. This self bias moves toward shutting the device off, generating further harmonics and intermodulation products. A large signal condition is defined as an input signal that is strong enough to distort the output signal beyond the IS97 specification.

In comparison, the class F amplifier is characterized by a load network that has resonances at one or more harmonic frequencies as well as the carrier frequency. The class F amplifier has a transistor that usually operates as a current source or a saturating current source, similar in operation to a classical class C power amplifier. A third-harmonic peaking amplifier provides an example of the operation of the class F amplifier. The transistor acts as a current source, producing the same half-sine-wave similar in operation to a class B amplifier. The fundamental-frequency tune circuit bypasses the harmonics, producing a sinusoidal output voltage. Generally, the third-harmonic resonator makes possible a third-harmonic component in the collector voltage, which flattens the collector voltage. An example of a class F amplifier is shown and described on pages 454–458 (See FIG. 14-9) of H. L. Krauss, Solid State Radio Engineering, John Wiley and Sons, New York, 1980.

But the class F amplifier does not amplify a signal linearly. The class F amplifier is essentially biased off, and strongly flattens the signal which introduces large amounts of IMD distortion. Thus the class F amplifier is not linear. Furthermore, the class F amplifier will not amplify low power signals. Thus if a signal is 10 dB below normal, then the class F amplifier will not amplify it. For example, CDMA signals with peak to average power ratios of 15 dB cannot be amplified linearly. The class F amplifier also has a radio frequency choke (RFC) which allows undesirable radio frequency harmonics to travel unfiltered through the amplifier.

In view of the above, there is a real need in the prior art for an amplifier that effectively filters harmonics from the radio frequency signal and also suppresses IMD products.

SUMMARY OF THE INVENTION

The invention provides a new kind of amplifier, known herein as a class A/F amplifier, that has an filtering and matching It input circuit, a summing junction, an amplifying circuit, a filtering and feedback biasing circuit, and an output filtering and matching circuit.

The filtering and matching input circuit responds to a radio frequency access input signal, for providing a filtered and matched radio frequency access input signal. The summing junction responds to the filtered and matched radio frequency access input signal, and further responds to a filtering and feedback biasing signal, for providing a summed, filtered, matched and feedback radio frequency access input signal. The amplifying circuit responds to the summed, filtered, matched and feedback radio frequency access input signal, for providing an amplified, summed, filtered, matched and feedback radio frequency access input signal. The feedback and filtering biasing circuit responds to the amplified, summed, filtered, matched and feedback radio frequency access input signal, for providing the feedback and filtering biasing signal. The output filtering and matching circuit responds to the amplified, summed, filtered, matched and feedback radio frequency access input signal, for providing an amplified, summed, filtered, matched and feedback radio frequency access output signal.

The input and output filtering may include a combination of one or more circuits for distortion shunting, impedance matching or harmonic filtering. The unique filtering and feedback biasing circuit provides for a set range of bias conditions over a large range of input signals. Over this range of bias conditions the bias network maintains adequate bias and linearity. Additionally, the gate capacitor in and drain capacitor out are part of the feedback network, and adjust the amount and frequency of the feedback by their respective capacitance to minimize bias induced distortion.

In particular, the class A/F amplifier is used in the mobile radio base station that receives the radio frequency access input signal from the mobile phone. The radio frequency access input signal may be either a frequency division multiple access (FDMA) signal, a time division multiple access (TDMA) signal, or a code division multiple access (CDMA) signal. The class A/F amplifier of the present invention effectively suppresses IMD products for use in spread spectrum or multi-tone power amplification.

One important advantage of the amplifier of the present invention is that there are substantially reduced harmonics in the amplified filter radio frequency access output signal to cause power interference between adjacent channels, resulting in greatly improved mobile communication service having much fewer dropped calls and a greatly improved calling range.

Other objects of the invention will in part be obvious and will in part appear hereinafter.

Accordingly, the invention comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the nature of the invention, reference should be made to the following detailed descriptions taken in connection with the accompanying drawings, not drawn to scale, in which.

BEST MODE FOR CARRYING OUT THE INVENTION

Figure 1:
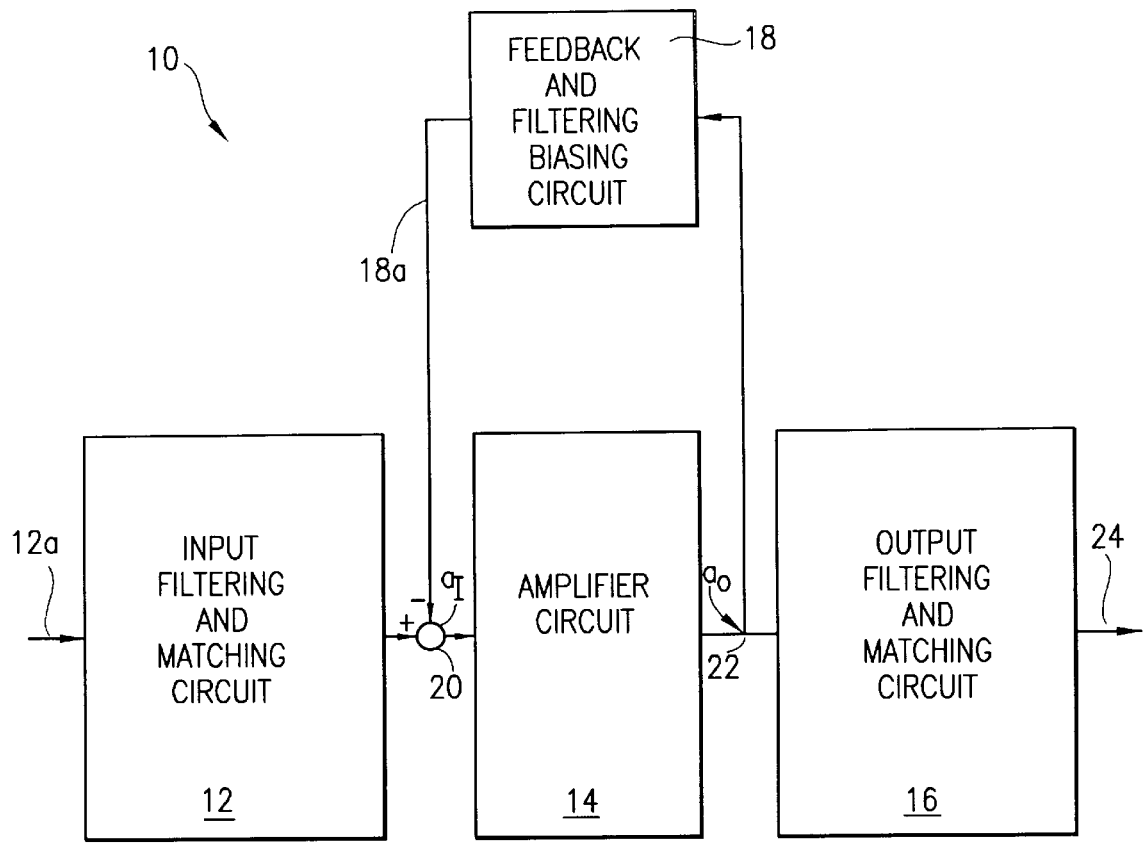
FIG. 1 shows a block diagram of a class A/F amplifier that is the subject matter of the present invention.

FIG. 1 shows an embodiment of an amplifier, which will be referred to hereinafter as a class A/F amplifier, generally indicated as 10.

The class A/F amplifier 10 has an input filtering and matching circuit generally indicated as 12, an amplifier circuit generally indicated as 14, an output filtering and matching circuit generally indicated as 16, a feedback and filtering biasing circuit generally indicated as 18, and a first summing junction 20.

The input filtering and matching circuit 12 responds to a radio frequency access signal along line 12a, for providing a filtered and matched radio frequency access input signal. A summing junction 20 responds to the filtered and matched radio frequency access input signal, and further responds to a feedback and filtered biasing signal along line 18a, for providing a summed filtered, matched and feedback radio frequency access input signal. The amplifying circuit 14 responds to the summed filtered, matched and feedback radio frequency access input signal, for providing an amplified filtered, matched and feedback radio frequency access input signal to node 22. The feedback and filtering biasing circuit 17 responds to the amplified harmonically filtered radio frequency input signal at node 20, for providing the feedback and filtered biasing signal indicated as 18a. The output filtering and matching circuit 16 responds to the amplified filtered radio frequency access input signal indicated as 22, for providing an amplified filtered and matched radio frequency access output signal generally indicated as 24 to an output circuit (not shown). The input and output filtering may include a combination of one or more circuits for distortion shunting, impedance matching or harmonic filtering, all of which will be discussed in greater detail below.

The class A/F amplifier 10 is used in a mobile radio base station (not shown) that receives the radio frequency access input signal 18 from a mobile phone (not shown). The radio frequency access input signal 18 may be either a frequency division multiple access (FDMA) signal, a time division multiple access (TDMA) signal, or a code division multiple access (CDMA) signal.

Figure 2:
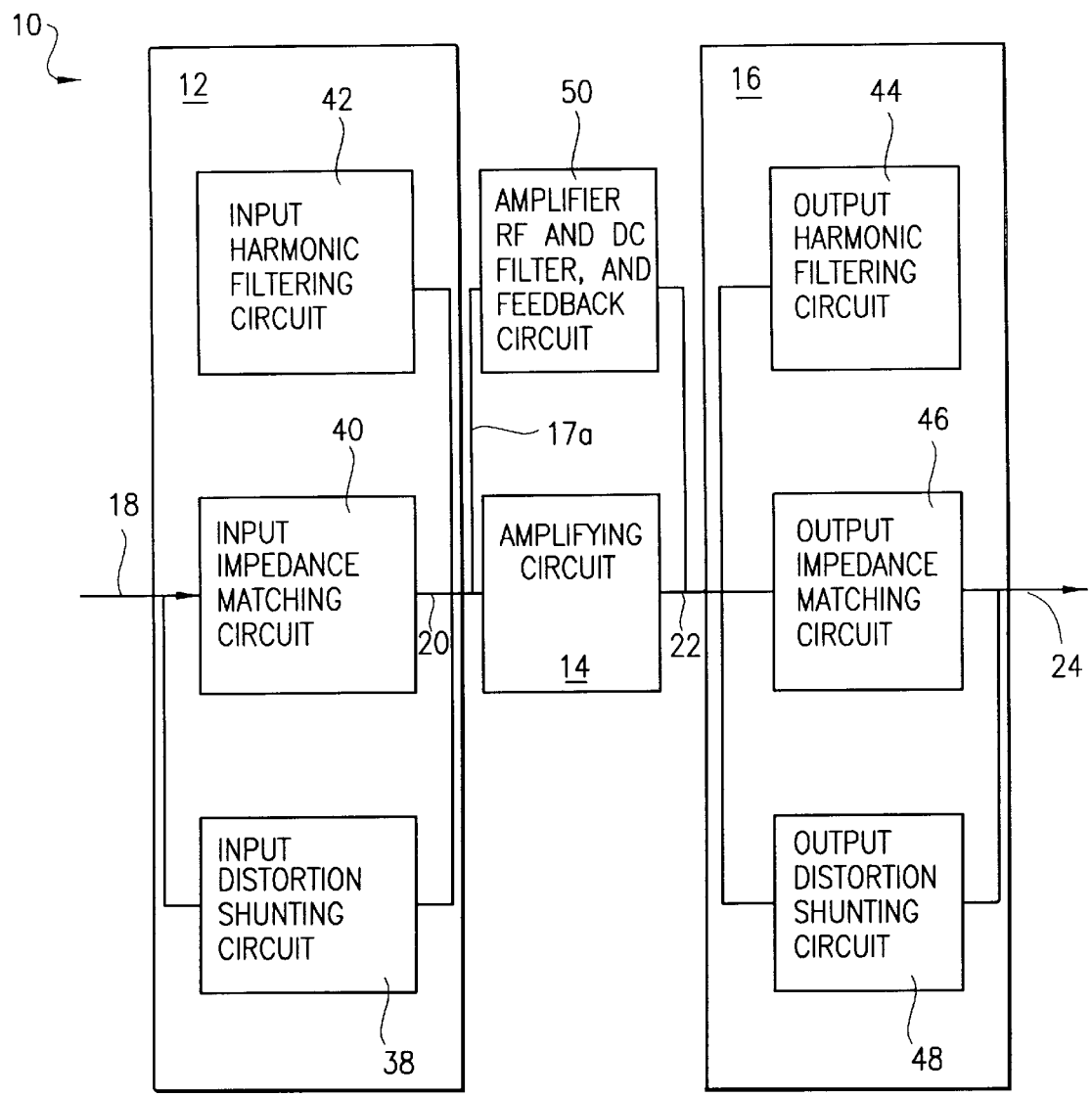
FIG. 2 shows a more detailed block diagram of the class A/F amplifier in FIG. 1.

FIG. 2 shows a more detailed block diagram of the class A/F amplifier in FIG. 1. On the input side of the amplifying circuit 14, the class A/F amplifier in FIG. 2 includes the following: input distortion shunting circuits 38, an input impedance matching circuit 40 and an input harmonic filtering circuit 42. On the output side of the amplifying circuit 14, the class A/F amplifier 10 in FIG. 2 includes the following: an output harmonic filtering circuit 44, an output impedance matching circuit 46 and an output distortion shunting circuit 48. The scope of the invention is not intended to be limited to any particular kind of distortion shunting, impedance matching or harmonic filtering circuits, all of which will be discussed in greater detail below.

One important feature of the present invention is that the radio frequency access input signal 18 is harmonically filtered on both the input and output sides of the amplifying circuit 14. The class A/F amplifier 10 in FIG. 2 also has an amplifier RF and DC bias filtering and feedback circuit 50 connecting the input side to the output side of the amplifying circuit 14. The amplifier RF and DC bias filtering and feedback circuit 50 corresponds to the filtering and feedback biasing circuit 17 in FIG. 1. The scope of the invention is not intended to be limited to any particular kind of amplifying, filtering or feedback circuit. The amplifying circuit 14 will be discussed in greater detail below with respect to FIG. 3.

Figure 3:
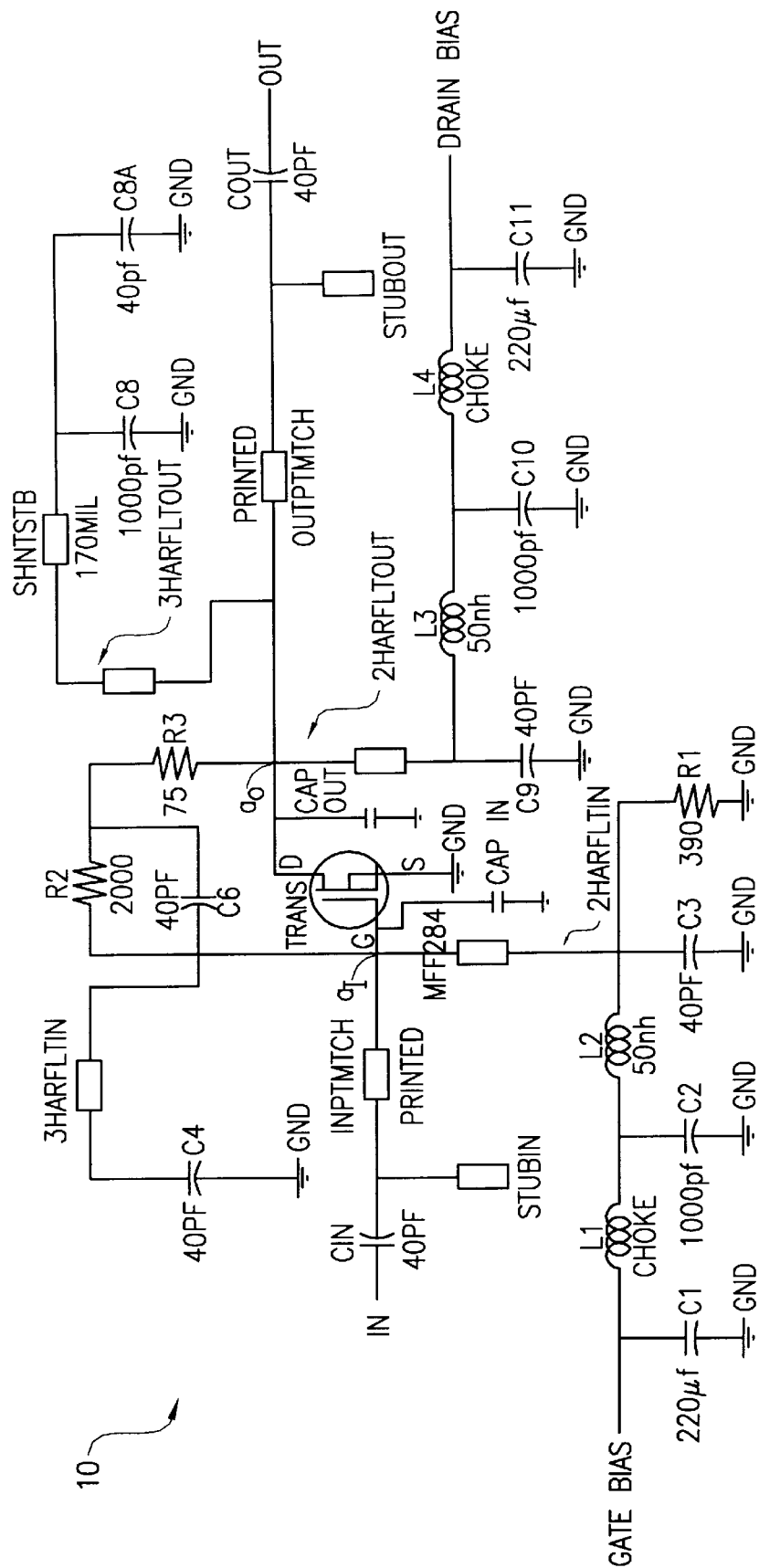
FIG. 3 is a schematic of the class A/F amplifier shown in FIGS. 1 and 2.

FIG. 3 is a schematic of the class A/F amplifier 10 in FIG. 2. For the readers convenience, the summing junction 20 is shown as an amplifier input point $a_I$ in FIGS. 1 and 3 and the amplifier output point $a_o$ are also indicated in FIGS. 1 and 3. In FIG. 2, the input distortion shunting and output distortion shunting circuits 38, 48 provide a low pass harmonic short function to the input and output signals of the class A/F amplifier 10. The input distortion shunting circuit 38 and the output distortion shunting circuit 48 of FIG. 2 are respectively indicated as STUBIN plus gate CAPIN and STUBOUT plus drain CAPOUT shown in FIG. 3. The circuits STUBIN and STUBOUT in FIG. 3 include an inductor and a capacitor connected in parallel to ground, not shown. The scope of the invention is not intended to be limited to any particular circuit design for the circuits STUBIN and STUBOUT in FIG. 3. For example, the inductor may be removed and the cap replaced with an open stub.

The input and output impedance matching circuits 40, 46 in FIG. 2 provide impedance matching for the class A/F amplifier 10 with an input or output circuit connected thereto (not shown). The input and output impedance matching circuit 40, 46 are generally indicated as INPTMCH and OUTPTMCH in FIG. 3. The impedance matching circuits INPTMCH and OUTPTMCH include an inductor and a capacitor connected in parallel, not shown, and coupled to the amplifying circuit 14. The scope of the invention is not intended to be limited to any particular circuit design for the impedance matching circuits INPTMCH and OUTPTMCH in FIG. 3.

The amplifying circuit 14 in FIG. 2 includes a field effect transistor (FET) generally indicated as TRANS in FIG. 3, having a gate connection G, a drain connection D and a source connection S. The scope of the invention is not intended to be limited to any particular type of amplifying circuit, transistor or FET transistor.

The input and output harmonic filtering circuits 42, 44 in FIG. 2 provide input and output harmonic filtering of the radio frequency access input signal before and after amplification by the amplifier circuit 14. The input harmonic filtering circuit 42 in FIG. 2 includes a second order input harmonic filtering circuit generally indicated as 2HARFLTIN in FIG. 3, and also includes a third order input harmonic filtering circuit generally indicated as 3HARFLTIN also in FIG. 3. The second order input harmonic filtering circuit 2HARFLTIN in FIG. 3 filters even harmonics from the radio frequency access input signal. The third order input harmonic filtering circuit 3HARFLTIN filters odd harmonics from the radio frequency access input signal. In FIG. 3, the second order input harmonic filtering circuit 2HARFLTIN and the third order input harmonic filtering circuit 3HARFLTIN may include a bandstop filter that is tuned to eliminate the harmonics from the radio frequency access input signal. The bandstop filter also includes respective transmission lines, each having a length of about ⅛ of the operating frequency wavelength or an odd multiple thereof such as ⅜, ⅝ etc. and 1/12 of the operating frequency wave or a multiple thereof such as 3/6, ⅝ etc., not generally including any multiple of ¼ of the operating frequency wavelength. Each field effect transistor (FET) will have distinct 2nd and 3rd harmonic load impedances required for best IMD supression. The load is tuned by slightly changing the lengths of these lines. The lines are also tuned to resonate out the even and odd has harmonies by grounding them. The bandstop filter may include an inductor and a capacitor connected in series (not shown) and coupled between the gate G of the transistor TRANS to ground.

Similarly, the output harmonic filtering circuit 44 in FIG. 2 includes a second order input harmonic filtering circuit generally indicated as 2HARFLTOUT in FIG. 3, and also includes a third order input harmonic filtering circuit generally indicated as 3HARFLTOUT also in FIG. 3. The second order input harmonic filtering circuit 2HARFLTOUT in FIG. 3 filters even harmonics from the amplified radio frequency access input signal. The third order input harmonic filtering circuit 3HARFLTOUT in FIG. 3 filters odd harmonics from the amplified radio frequency access input signal. In FIG. 3, the second order input harmonic filtering circuit 2HARFLTOUT and the third order input harmonic filtering circuit 3HARFLTOUT may include a bandstop filter that is tuned to eliminate the harmonics from the radio frequency access input signal. The bandstop filter also has transmission lines respectively having a length of about ⅛ of the operating frequency wavelength or an odd multiple thereof such as ⅜, ⅝ etc. and 1/12 of the operating frequency wave or a multiple thereof such as 3/6, ⅝ etc., not generally including any multiple of ¼ of the operating frequency wavelength. As discussed above, each FET will have distinct 2nd and 3rd harmonic load impedances required for best IMD supression. The is load is tuned by slightly changing the lengths of these lines. The lines are tuned to resonate out the even and odd has harmonies by grounding them. The bandstop filter may include an inductor and a capacitor (not shown) coupled between the drain D of the transistor TRANS to ground.

The input and output harmonic filtering circuits 42, 44 in FIG. 2 may include a bias or harmonic filter cap circuit. The filter cap circuit includes one or more capacitors generally indicated as C1–C4 and C8–C11, one or more inductors generally indicated as L1–L4 or one or more resistors R1 coupled to ground, all shown in FIG. 3. These components in the prior art functioned as bias caps. In the present invention, these components perform optional filtering to reduce IMD distortion in the input harmonic filtering network. For example, in FIG. 3 a capacitor C3 provides a filtering cap for the second order input harmonic filtering circuit 2HARFLTIN, a capacitor C4 provides a filtering cap for the third order input harmonic filtering circuit 3HARFLTIN, a capacitor C9 provides a filtering cap for the second order input harmonic filtering circuit 2HARFLTOUT, and a shuntstub generally indicated as SHNTSTB, and capacitors C8, C8A provide a filtering cap for the third order input harmonic filtering circuit 3HARFLTOUT. In the third order input harmonic filtering circuit 3HARFLTOUT, the shuntstub circuit SHNTSTB and the capacitors C8, C8A when used together have produced enhanced performance for the amplifier as a whole. The shuntstub circuit SHNTSTB includes an inductor and a capacitor connected in parallel to the output impedance matching circuit 46.

In FIG. 3, capacitors generally indicated as CIN, COUT provide a DC bypassing function on the input and output sides of the class A/F amplifier 10.

As shown, the field effect transistor TRANS has the feedback circuit or connection 50 between the drain D and the gate 6 for suppressing oscillations in the class A/F amplifier, that also includes a DC feedback resistor R2 to minimize the effect of DC changes during ageing, a RF feedback resistor R3 to minimize the effect of RF changes during ageing, and a feedback bypass capacitor C6. The feedback is adjusted to minimize self bias generated distortion, which works in depletion mode devices. The scope of the invention is not intended to be limited to embodiments having such a feedback circuit or connection 50.

General Discussion of the Operation of the Amplifier

In operation, the class A/F amplifier of the present invention encompasses the advantages of both the class A and class F amplifiers combined and eliminates the disadvantages thereof. Specifically, the class A/F amplifier of the present invention uses a bias point halfway between the class A and F amplifiers. Thus the class A/F amplifier is more efficient than class A, and more linear than class F. The class A/F amplifier has the high power gain of the class A amplifier and also amplifies reduced power signals, while having the harmonic filters of the class F amplifier, thus suppressing IMD signals.

The most significant advantage of the present invention is that the class A/F amplifier filters, when operated at a class A bias, significantly reduce the intermodulation distortion (IMD), which the class A amplifier normally cannot suppress. The class A/F amplifier suppresses the IMD while maximizing linear efficiency.

In a particular application for a mobile communication system, such as a Personal Communication Service system, the class A/F amplifier having the aforementioned novel matching network has been shown to increase the CDMA power and linear efficiency when compared to a class A amplifier. The simple, inexpensive class F amplifier structure suppresses the 3rd and 5th order products more than 10 dB over the class A amplifier. A 6.5 watt CDMA PCS class A/F amplifier demonstrated 20% linear efficiency: a threefold improvement in linear efficiency over typical PCS base station having the class A amplifier. The 6.5 watt amplifier demonstrated a 2.7 times improvement in linear power over a similar class A amplifier (power matched but without the class F traps). The class A/F amplifier improves linear power when compared to the class A amplifier, by using a series of harmonic traps and filters, while maintaining intersymbol interference levels through an intrinsic cosine filter. Linearity is not degraded by unequal power tones as in the class A/B amplifiers.

In effect, the class A/F amplifier of the present invention uses four similar filters on the input and the output as well, as shown in FIG. 3. The filter next to the transistor TRANS is a single pole shunt capacitor, which is labeled gate capacitor CAPIN on the input and drain capacitor CAPOUT on the output. The capacitors gate CAPIN and drain CAPOUT plus the intrinsic inductance of the transistor TRANS act as low pass filters, and slightly round the output from pulse to pulse which suppresses the spectral regrowth. These capacitors also are used with the feedback to adjust the amount of self biasing. The next filter is a pair of series tanks to ground, which consist of a short piece of transmission line ended with a cap shorted to ground. One series filter resonates (minimizes) the even harmonics which is labeled 2HARFLTIN (input), and 2HARFLTOUT (output) and the other filter resonates (minimizes) the odd harmonics which are labeled 3HARFLTIN (input), and 3HARFLTOUT (output). As discussed above, if the harmonics are suppressed then the intermodulation components will also be suppressed. The last and final filter/matching network is a series quarter-wave-line at the third harmonic followed by open stubs, which are labeled STUBIN and STUBOUT. The final filter/matching network acts as a third harmonic short.

One selection criteria for the transistor is to pick one that has the highest linear efficiency. This can be accomplished by load pulling transistors under two-tone drive conditions to determine which has the greatest linear efficiency. In practice, a number of transistors were tested and Lateral Drain Metal Oxide Semiconductor (LDMOS) transistors were selected and measured. Bipolar Junction Transistors (BJT) achieve around 5% efficiency at 40 dB carrier to IM3 ratios (i.e. 3rd Order Intermodulation Products). In comparison, LDMOS transistors, when operating the class A/F amplifier, achieve nearly 20% efficiency at similar IMD ratios.

A single stage LDMOS class A/F amplifier was tested. While operating with the class F components removed and with power matching, the single stage LDMOS class A/F amplifier operated at IS-97 linearity levels of 2.4 watts. When operating with the class F network attached, the single stage LDMOS class A/F amplifier produced 5.5 watts of linear IS-97 power levels as shown in FIG. 8. Noise levels (CDMA spec levels) of the amplifiers were compared. The class A/F amplifier did not increase the noise floor. Both amplifiers were operated at the same bias power of 37 watts. Therefore, the class A efficiency was 6.4%, while the class A/F efficiency was 17.3%.

In summary, the class A/F amplification provides improved linear efficiency when compared to class A and class AB amplifiers. A three fold improvement in linear efficiency was found, which was accomplished by reducing the second and third harmonics through use of class F traps.

The class A/F amplifier of the present invention is also an important contribution to the state of the art for other reasons: It has been shown that CDMA (a common spread spectrum signal) is a noise-like signal immune at a minimum of 30 dB to spurious non spread-spectrum signals. The CDMA is also susceptible to its own spectral regrowth interference, which limits the system capacity. Thus, for PCS CDMA systems to operate most cost effectively, inexpensive linear power amplifiers are required. Power amplifier linearity is determined by transistor performance and signal parameters. First, transistor performance parameters such as gate rectification or nonlinear variation of transistor charge are significant causes of nonlinearity. Second, CDMA signals have reduced linearity for multiple reasons: Commercial PCS systems operate under wideband-width BPSK-DS-SS modulation at a high modulation rate with a two sigma statistical peak of 6 dB peak to average ratio. Then if one analyzes the harmonics of multitone signals to determine the power coefficients, i.e. using the MacLaurin case of the Taylor series, one sees that the harmonics and their associated intermodulation components can be quite strong which results in intersymbol interference and the associated BER degradation limiting the capacity of the PCS CDMA wireless system.

In addition to linearity, power added efficiency is a critical parameter because of the heat generation. In the past heat generation was not a problem. However, more recently the public is increasingly resisting the addition of large tower sites. This forces more creative placement of PCS base stations. This space restriction resulted in requirements for less heat generation. This heat also affects reliability. Hot amplifiers have low reliability.

Background Analysis of the Overall Performance

Background analysis of the overall performance of the class A/F of the present invention is briefly discussed below: One can mathematically analyze the significance of the harmonics through use of a Taylor series of two tones. Through measurements we found that the harmonic and intermodulation products from a saturated amplifier approximately followed a tanh function. To calculate these products one calculates the first to third order derivatives of the tanh function. It was found the Taylor series coefficients to be 0 for the DC term, 1 for the f1 term, 0 for the f2 term and $-\frac{1}{3}$ for the f3 term by solving the equation:

$$y_{(t)} = \{[A(\sin(w_1 t) + \sin(w_2 t)) - .33A^3\{1 - \cos(2W_1 t))/2 +$$
$$(1 - \cos(2W_2 t))/2 + [\cos(w_1 - w_2)t -$$
$$\cos(w_1 + w_2)t]\{\sin(w_1 t) + \sin(w_2 t)\}]^2\}/50$$

The powers (summed Taylor coefficients) of each carrier are determined to be $(A^2)/50$ and each of the third order products are determined to be $(((A^3)/4)^2)/50$. These coefficients (and further measurements) show that at saturated output power the third order distortion products will be 12 dB down below the carrier. Shorting out the harmonic mathematically removes the 2f2-f1 term and the 2f1-f2 term. Measurements show that the terms are reduced more than 20 dB. When implemented these networks allow the transistor to be operated much closer to saturation than a non-class F transistor. The CDMA amplifiers have a 15 dB peak to average ratio. To obtain the needed linearity the amplifiers output power was backed-off 7 dB, when compared to the typically required 11 dB back-off from a bipolar junction transistor. Thus the class A/F amplifier is backed off only 7 dB while operated at the bias of a class A amplifier backed off 11 dB. Therefore, the class A/F amplifier has 4 dB more output power than the class A amplifier at the same linearity, with an associated improvement in efficiency.

Figure 4:
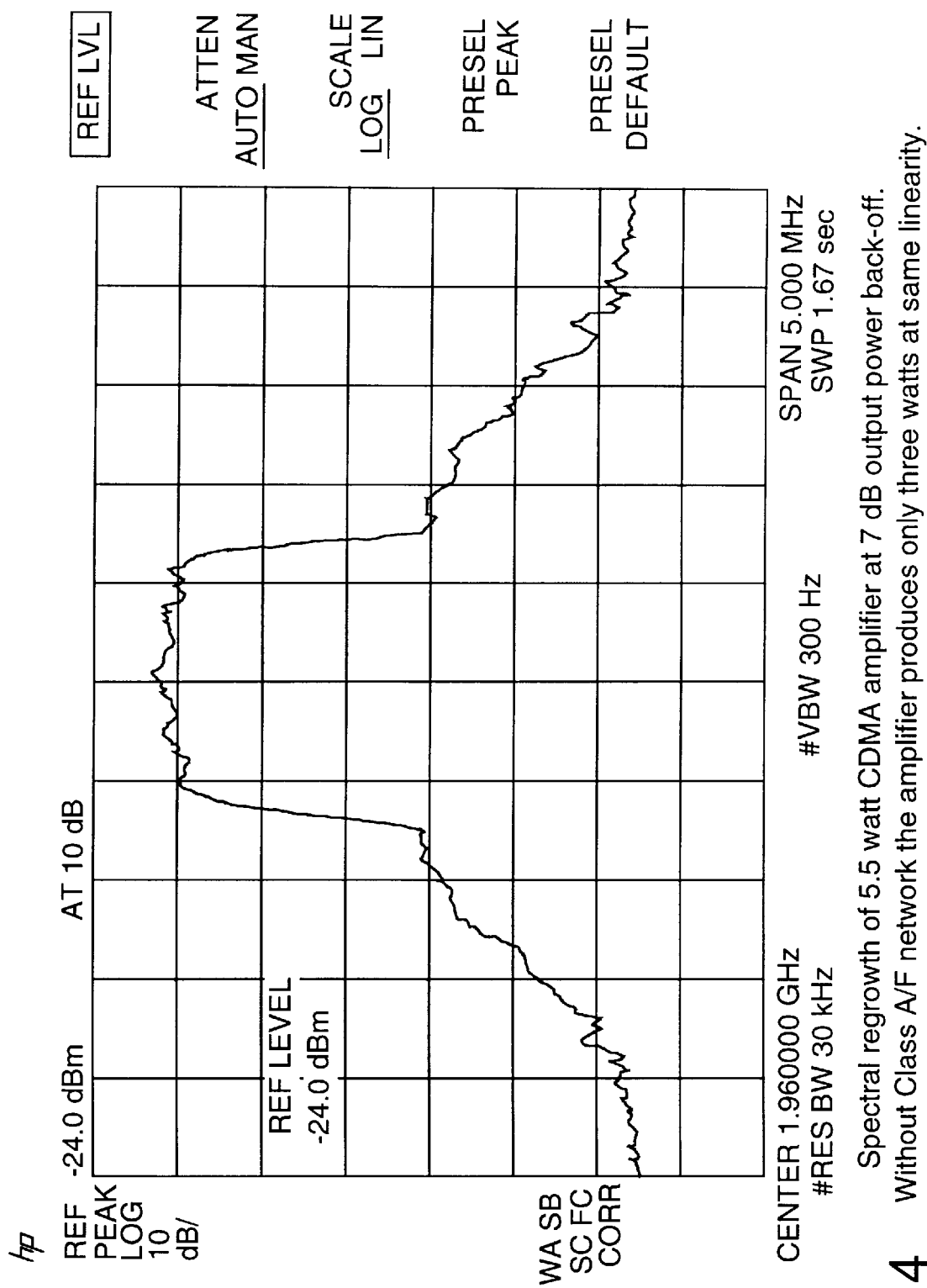
FIG. 4 is a graph of spectral regrowth of a 5.5 watt CDMA amplifier at 7 dB output power back-off.

To remove the harmonics, the class F amplifier is used. A class F amplifier is a class B amplifier which has additional harmonic-suppression-networks for development of a squarer wave form which improves efficiency, as shown in FIG. 4. The class A/F amplifier when operated at its most efficient point is not very linear. But when backed off the class A/F amplifier is more linear and efficient than the class A amplifier. The industry custom is to use a class A/B amplifier to amplify the signal. When one biases the class A/B amplifier, it is more linear and efficient with a pair of equal tones than the class A amplifier. But, when the tones are not of equal strength, the class A/B amplifier is self biased by the higher of the two tones which suppresses and distorts the lower of the two tones. The class A/B amplifier acts like a limited filter which distorts lower power signals and in the process generates higher noise power. A recent measurement found the noise floor of the class A/B amplifier increased by 6 dB. This increased noise power acts as an interference which significantly reduces the wireless systems range and capacity. Thus the class A/B amplifier increased the amplifier efficiency at the cost of link efficiency.

Components List For Schematic FIG. 3

| Component | Function |
| --- | --- |
| CIN, COUT | DC bypassing capacitors |
| C1–C4, C8–C11 | Filter capacitors |
| CAPIN | Gate capacitor for gain adjust, self bias control, harmonic supression |
| CAPOUT | Drain capacitor for gain adjust, self bias control, harmonic supression |
| C6 | Feedback bypassing capacitor |
| R2 | DC feedback resistor that minimizes device DC changes during aging and sets device self-bias for maximizing linearity |
| R3 | RF feedback resistor that minimizes device RF changes during aging and minimizes Rf generated self biasing |
| TRANS | Motorola LDMOS transistor (although approach will work with any field effect transistor) |
| STUBIN | Class A/F lowpass filter odd harmonic short |
| STUBOUT | Class A/F lowpass filter odd harmonic short |
| 2HARFLTIN | Class A/F bandstop filter even harmonics in |
| 3HARFLTIN | Class A/F bandstop filter odd harmonics in |
| 2HARFLTOUT | Class A/F bandstop filter even harmonics out |
| 3HARFLTOUT | Class A/F bandstop filter odd harmonics out |

General Reference Guide

Some other general references in the field include: T. S. Rappaport, Wireless Communications Principles & Practice, Prentice Hall PTR, Upper Saddle River, N.J., 1996; L. W. Couch II, Analog and Digital Communication Systems, Macmillin Pub. Company, New York, 1987; Wu et al., "Linear RF Power Amplifier Design for CDMA Signals", IEEE MTT-S Digest, 1996, Page 851; and R. S. Brozovich, D. R. Helms et al. "Highly-Linear Highly-Efficient HBT for Communications Circuits." GaAs IC, 1994, page 291.

Scope of the Invention

Although the present invention has been described and discussed herein with respect to at least one embodiment, other arrangements or configurations may also be used that do not depart from the spirit and scope of the invention.

For example, the scope of the invention is not intended to be limited to any particular capacitance, inductance or resistance shown in FIG. 3.

Moreover, the scope of the invention is not intended to be limited to an amplifier for amplifying only a radio frequency access input signal, like the frequency division multiple access (FDMA) signal, the time division multiple access (TDMA) signal, or the code division multiple access (CDMA) signal. The thrust of the invention relates to harmonic filtering of any signal before and after amplification. For instance, embodiments are envisioned wherein the amplifier is a class A/F amplifier having a harmonic filtering circuit that responds to any input signal, for providing a harmonically filtered input signal, and further responds to an amplified harmonically filtered input signal, for providing any amplified harmonically filtered output signal.

The class A/F amplifier has an amplifying circuit that responds to the harmonically filtered input signal, for providing the amplified harmonically filtered input signal.

The harmonic filtering circuit also has an input harmonic filtering circuit for filtering harmonics from the input signal, and output harmonic filtering circuit for filtering harmonics from the amplified harmonically filtered input signal. (The input filtering removes transistor generated distortion.)

The input harmonic filtering circuit has a second order input harmonic filtering circuit for filtering even harmonics from the input signal, and a third order input harmonic filtering circuit for filtering odd harmonics from the input signal.

The output harmonic filtering circuit has a second order output harmonic filtering circuit for filtering even harmonics from the amplified harmonically filtered input signal, and a third order output harmonic filtering circuit for filtering odd harmonics from the amplified harmonically filtered input signal.

I claim:

1. An amplifier comprising:

an input harmonic filtering and matching circuit, responsive to a radio frequency access input signal, for providing a harmonically filtered and matched radio frequency access input signal;

a summing junction, responsive to the harmonically filtered and matched radio frequency access input signal, and further responds to a feedback and filtering biasing signal, for providing a summed, harmonically filtered, matched and feedback radio frequency access input signal;

an amplifying circuit, responsive to the summed, harmonically filtered, matched and feedback radio frequency access input signal, for providing an amplified, summed, harmonically filtered, matched and feedback radio frequency access input signal;

a feedback and filtering biasing circuit, responsive to the amplified, summed, harmonically filtered, matched and feedback radio frequency access input signal, for providing the feedback and filtering biasing signal; and an output harmonic filtering and matching circuit, responsive to the amplified, summed, harmonically filtered, matched and feedback radio frequency access input signal, for providing an amplified, summed, harmonically filtered, matched and feedback radio frequency access output signal.

2. An amplifier according to claim 1, wherein the input harmonic filtering and matching circuit includes:

a second order input harmonic filtering circuit for filtering even harmonics from the radio frequency access input signal; and a third order input harmonic filtering circuit for filtering odd harmonics from the radio frequency access input signal.

3. An amplifier according to claim 1,
wherein the output harmonic filtering and matching circuit includes:
- a second order output harmonic filtering circuit for filtering even harmonics from the amplified, summed, harmonically filtered, matched and feedback radio frequency access input signal; and
- a third order output harmonic filtering circuit for filtering odd harmonics from the amplified, summed, harmonically filtered, matched and feedback radio frequency access input signal.

4. An amplifier according to claim 1,
wherein the input harmonic filtering and matching circuit includes:
- a second order input harmonic filtering circuit for filtering even harmonics from the radio frequency access input signal, and
- a third order input harmonic filtering circuit for filtering odd harmonics from the radio frequency access input signal; and wherein the output harmonic filtering and matching circuit includes:
- a second order output harmonic filtering circuit for filtering even harmonics from the amplified, summed, harmonically filtered, matched and feedback radio frequency access input signal, and
- a third order output harmonic filtering circuit for filtering odd harmonics from the amplified, summed, harmonically filtered, matched and feedback radio frequency access input signal.

5. An amplifier according to claim 1,
wherein the input harmonic filtering and matching circuit includes a bandstop filter that is tuned to eliminate the harmonics from the radio frequency access input signal.

6. An amplifier according to claim 5, wherein the bandstop filter includes an inductor and a capacitor connected in series and coupled to ground.

7. An amplifier according to claim 1, wherein the output harmonic filtering and matching circuit includes a bandstop filter that is tuned to elimanate the harmonics from the amplified, summed, harmonically filtered, matched and feedback radio frequency access input signal.

8. An amplifier according to claim 7, wherein the bandstop filter includes an inductor and a capacitor connected in series and coupled to ground.

9. An amplifier according to claim 1, wherein the radio frequency access input signal is either a frequency division multiple access (FDMA) signal, a time division multiple access (TDMA) signal, or a code division multiple access (CDMA) signal.

10. An amplifier according to claim 1,
wherein the input harmonic filtering and matching circuit includes an input distortion shunting circuit for providing a low pass harmonic short function on an end of the amplifier circuit; and
wherein the output harmonic filtering and matching circuit includes an output distortion shunting for providing a low pass harmonic short function on an output end of the amplifier circuit.

11. An amplifier according to claim 10, wherein the input distortion shunting circuit includes an inductor and a capacitor connected in parallel to ground.

12. An amplifier according to claim 10, wherein the output distortion shunting circuit includes an inductor and a capacitor connected in parallel to ground.

13. An amplifier according to claim 4, wherein the third order input harmonic filtering circuit has a distortion shunting network for suppressing third order intermodulation products.

14. An amplifier according to claim 1, wherein the input harmonic filtering and matching circuit includes a filter cap circuit having capacitors coupled to ground.

15. An amplifier according to claim 14, wherein the filter cap circuit also includes at least one inductor or resistor.

16. An amplifier according to claim 1, wherein the amplifying circuit includes a transistor.

17. An amplifier according to claim 16, wherein the transistor is a field effect transistor having a gate connection, a drain connection and a source connection.

18. A feedback network according to claim 17, wherein the amplified, summed, filtered, matched and feedback radio frequency access input signal is a composite signal at 180° out of phase with the radio frequency access input signal, for suppressing self biasing caused by the feedback amplified harmonically filtered radio frequency access input signal attempting to turn off the amplifier circuit.

19. An amplifier comprising:
- an input harmonic filtering circuit, responsive to a radio frequency access input signal, for providing a harmonically filtered radio frequency access input signal;
- a summing junction, responsive to the harmonically filtered radio frequency access input signal, and further responds to a feedback and filtering biasing signal, for providing a summed, harmonically filtered and feedback radio frequency access input signal;
- an amplifying circuit, responsive to the summed, harmonically filtered and feedback radio frequency access input signal, for providing an amplified, summed, harmonically filtered and feedback radio frequency access input signal;
- a feedback and filtering biasing circuit, responsive to the amplified, summed, harmonically filtered and feedback radio frequency access input signal, for providing the feedback and filtering biasing signal; and
- an output harmonic filtering circuit, responsive to the amplified, summed, harmonically filtered and feedback radio frequency access input signal, for providing an amplified, summed, harmonically filtered and feedback radio frequency access output signal.

20. An amplifier according to claim 19,
wherein the input harmonic filtering circuit includes:
- a second order input harmonic filtering circuit for filtering even harmonics from the radio frequency access input signal; and
- a third order input harmonic filtering circuit for filtering odd harmonics from the radio frequency access input signal.

21. An amplifier according to claim 19,
wherein the output harmonic filtering circuit includes:
- a second order output harmonic filtering circuit for filtering even harmonics from the amplified, summed, harmonically filtered, matched and feedback radio frequency access input signal; and
- a third order output harmonic filtering circuit for filtering odd harmonics from the amplified, summed, harmonically filtered, matched and feedback radio frequency access input signal.

22. An amplifier according to claim 19,
wherein the input harmonic filtering circuit includes:
- a second order input harmonic filtering circuit for filtering even harmonics from the radio frequency access input signal, and a third order input harmonic filtering circuit for filtering odd harmonics from the radio frequency access input signal; and wherein the output harmonic filtering circuit includes:
   a second order output harmonic filtering circuit for filtering even harmonics from the amplified, summed, harmonically filtered and feedback radio frequency access input signal, and
   a third order output harmonic filtering circuit for filtering odd harmonics from the amplified, summed, harmonically filtered and feedback radio frequency access input signal.

23. An amplifier according to claim 19,
wherein the input harmonic filtering circuit includes a bandstop filter that is tuned to eliminate the harmonics from the radio frequency access input signal.

24. An amplifier according to claim 19, wherein the harmonic output filtering circuit includes a bandstop filter that is tuned to eliminate the harmonics from the amplified, summed, harmonically filtered and feedback radio frequency access input signal.

25. An amplifier according to claim 19,
   wherein the input harmonic filtering circuit includes an input distortion shunting circuit for providing a low pass harmonic short function on an input end of the amplifier circuit; and
   wherein the output harmonic filtering and matching circuit includes an output distortion shunting circuit for providing a low pass harmonic short function on an output end of the amplifier circuit.

* * * * *

UNITED STATES PATENT AND TRADEMARK OFFICE
CERTIFICATE OF CORRECTION

PATENT NO : 5,969,575
DATED : October 19, 1999
INVENTOR(S): Helms

It is certified that error appears in the above-identified patent and that said Letters Patent is hereby corrected as shown below:

At column 11, line 42, "elimanate" should be replaced with --eliminate--.

At column 11, line 56, --input-- should be inserted before "end".

At column 11, line 59, --circuit-- should be inserted after "shunting".

At column 12, lines 57 and 61, ", matched" should be deleted.

At column 14, line 11, "and matching" should be deleted.

Signed and Sealed this

First Day of August, 2000

Attest:

Q. TODD DICKINSON

*Attesting Officer*  *Director of Patents and Trademarks*